US010681455B2

(12) United States Patent
Kim et al.

(10) Patent No.: US 10,681,455 B2
(45) Date of Patent: Jun. 9, 2020

(54) MICROPHONE AND MANUFACTURING METHOD THEREOF

(71) Applicants: HYUNDAI MOTOR COMPANY, Seoul (KR); KIA MOTORS CORPORATION, Seoul (KR)

(72) Inventors: Hyunsoo Kim, Seoul (KR); Ilseon Yoo, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/192,407

(22) Filed: Nov. 15, 2018

(65) Prior Publication Data

US 2019/0090048 A1 Mar. 21, 2019

Related U.S. Application Data

(62) Division of application No. 15/263,594, filed on Sep. 13, 2016, now abandoned.

(30) Foreign Application Priority Data

May 26, 2016 (KR) ........................ 10-2016-0064847

(51) Int. Cl.

| | |
|---|---|
| ***B81C 1/00*** | (2006.01) |
| ***H04R 1/28*** | (2006.01) |
| ***H04R 19/00*** | (2006.01) |
| ***H04R 19/04*** | (2006.01) |
| ***H04R 31/00*** | (2006.01) |

(52) U.S. Cl.

CPC ......... *H04R 1/2807* (2013.01); *H04R 19/005* (2013.01); *H04R 19/04* (2013.01); *H04R 31/003* (2013.01)

(58) Field of Classification Search

None

See application file for complete search history.

(56) References Cited

U.S. PATENT DOCUMENTS

| | | | |
|---|---|---|---|
| 8,121,331 | B2 | 2/2012 | Minervini |
| 8,472,648 | B2 | 6/2013 | Wang et al. |
| 8,571,239 | B2 | 10/2013 | Feiertag et al. |
| 2007/0001551 | A1 | 1/2007 | Izumi et al. |
| 2010/0284553 | A1 | 11/2010 | Conti et al. |
| 2012/0237073 | A1 | 9/2012 | Goida et al. |

FOREIGN PATENT DOCUMENTS

| | | | |
|---|---|---|---|
| JP | 5057572 | B2 | 10/2012 |
| KR | 10-0941893 | B1 | 2/2010 |
| WO | 2016-029378 | A1 | 3/2016 |

OTHER PUBLICATIONS

Final Office Action issued in related U.S. Appl. No. 15/263,594 dated Aug. 15, 2018.

Non-Final Office Action issued in related U.S. Appl. No. 15/263,594 dated Feb. 7, 2018.

*Primary Examiner* — Reema Patel

(74) *Attorney, Agent, or Firm* — Morgan, Lewis & Bockius LLP

(57) ABSTRACT

A microphone includes an acoustic element including an acoustic hole; a case disposed below the acoustic element and including an acoustic inlet formed in a position corresponding to the acoustic hole; and a plurality of through holes formed between the acoustic element and the case and formed in a position corresponding to the acoustic hole.

7 Claims, 16 Drawing Sheets

MICROPHONE AND MANUFACTURING METHOD THEREOF

CROSS-REFERENCE TO RELATED APPLICATION

This application is the Divisional Application of U.S. application Ser. No. 15/263,594 filed on Sep. 13, 2016, which claims the benefit of priority to Korean Patent Application No. 10-2015-0064847, filed on May 26, 2016 in the Korean Intellectual Property Office, the entirety of which is incorporated herein by reference.

TECHNICAL FIELD

The present disclosure relates to a microphone and, more particularly, to a microphone with durability enhanced through an acoustic dispersion filter provided between an acoustic element and a case, and a manufacturing method thereof.

BACKGROUND

In general, microphones are devices converting a voice into an electrical signal. Microphones are required to have desirable electronic and acoustic performance, reliability, and operability. Microphones have increasingly been reduced in size. Thus, there has been research into microphones using a micro-electro mechanical system (MEMS) technology.

MEMS microphones are manufactured using a semiconductor batch process. MEMS microphones have tolerance to moisture and heat, and can be miniaturized and integrated with a signal processing circuit, compared with conventional electric condenser microphones (ECMs).

Also, MEMS microphones have excellent sensitivity and low performance deviation by products, compared with conventional ECMs. Thus, MEMS microphones have been applied to various application fields, replacing ECMs.

In general, MEMS microphones may be classified as piezoelectric MEMS microphones and capacitive MEMS microphones.

A piezoelectric MEMS microphone includes a vibrating diaphragm, and when the vibrating diaphragm is deformed by external sound, an electrical signal is generated according to a piezoelectric effect to thus measure sound pressure.

A capacitive MEMS microphone includes a fixed electrode and a vibrating diaphragm, and when external sound is applied to the vibrating diaphragm, a space between the fixed electrode and the vibrating diaphragm is changed, thus altering a value of a capacitance. Sound pressure is measured according to the generated electrical signal.

However, most MEMS microphones have a chamber formed by etching on a silicon substrate on one side thereof to allow a sound to pass therethrough, and as the size of an acoustic element is decreased, an area of a vibrating diaphragm is increased against the overall size. In such a structure, if an external impact is applied to a wafer substrate, distortion thereof, or the like, affects residual stress of the vibrating diaphragm itself, and here, stress of the vibrating diaphragm is changed by the external impact to degrade sensitivity of the microphone.

That is, in the related art MEMS microphone, the vibrating diaphragm itself sensing a sound is so thin that it is damaged by a physical external impact in many cases, compared with other condenser-type microphones such as an ECB, or the like.

Matters described in the background art section are provided to promote understanding of the background of the present disclosure, which may include matter that is not prior art known to those skilled in the art to which the present disclosure pertains.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide a microphone including an acoustic dispersion filter protecting a vibrating diaphragm of an acoustic element from an external impact, and a manufacturing method thereof.

The present disclosure has also been made in an effort to provide a microphone including an acoustic dispersion filter provided between an acoustic element and a case.

An exemplary embodiment in the present disclosure provides a microphone including: an acoustic element including an acoustic hole; a case disposed below the acoustic element and including an acoustic inlet formed in a position corresponding to the acoustic hole; and a plurality of through holes formed between the acoustic element and the case and formed in a position corresponding to the acoustic hole.

The acoustic element may include: a substrate including the acoustic hole; a vibrating diaphragm formed on the substrate and vibrated by an acoustic signal input through the acoustic inlet; and a fixed electrode formed on the vibrating diaphragm and spaced apart from the vibrating diaphragm by an interval.

The substrate of the acoustic element may be formed of silicon, and the acoustic dispersion filter may be formed of ion-implanted silicon.

Another exemplary embodiment in the present disclosure provides a method for manufacturing a microphone including steps of: forming an acoustic element including an acoustic dispersion filter formed on one side of the acoustic element; forming a case including an acoustic inlet; and bringing the acoustic element and the case into contact with each other. The acoustic dispersion filter includes a plurality of through holes, the acoustic element includes an acoustic hole, and the acoustic hole, the plurality of through holes, and the acoustic inlet are formed in positions corresponding to each other.

According to exemplary embodiments in the present disclosure, since the acoustic dispersion filter is formed between the acoustic element and the case, an acoustic signal having high pressure, or air pressure, may be dispersed and not concentrated on the center of the vibrating diaphragm, thus protecting the vibrating diaphragm. Also, a change in performance due to a change in stress that occurs when the acoustic element is attached to the case may be prevented through the acoustic dispersion filter, and a distortion phenomenon due to an external impact, or the like, may be prevented.

Other effects that can be obtained or expected from the embodiments in the present disclosure will be explicitly or implicitly disclosed by the detailed description of the embodiments. That is, various effects expected from the exemplary embodiments in the present disclosure will be disclosed in the following description.

DETAILED DESCRIPTION OF THE EMBODIMENTS

Hereinafter, an operational principle of a microphone and a manufacturing method thereof according to exemplary embodiments in the present disclosure will be described in detail with reference to the accompanying drawings. However, the accompanying drawings and detailed descriptions hereinafter related to a preferred one of various exemplary embodiments to effectively described features of the present disclosure. Thus, the present disclosure should not be limited to the accompanying drawings and descriptions.

Also, in describing exemplary embodiments in the present disclosure, if it is determined that a detailed description of known functions and components unnecessarily obscure the gist of the present disclosure, the detailed description thereof will be omitted. The terms used henceforth are defined in consideration of the functions of the exemplary embodiments, and may be altered according to the intent of a user or operator, or conventional practice. Therefore, the terms should be defined on the basis of the entire content of this specification.

Also, in the following description of the exemplary embodiments, in order to effectively describe core technical features of the embodiments, terms will be appropriately deformed, integrated, or separately used such that a person skilled in the art to which the present disclosure pertains may clearly understand it, but the present disclosure is not limited thereto.

Hereinafter, exemplary embodiments in the present disclosure will be described with reference to the accompanying drawings.

Figure 1:
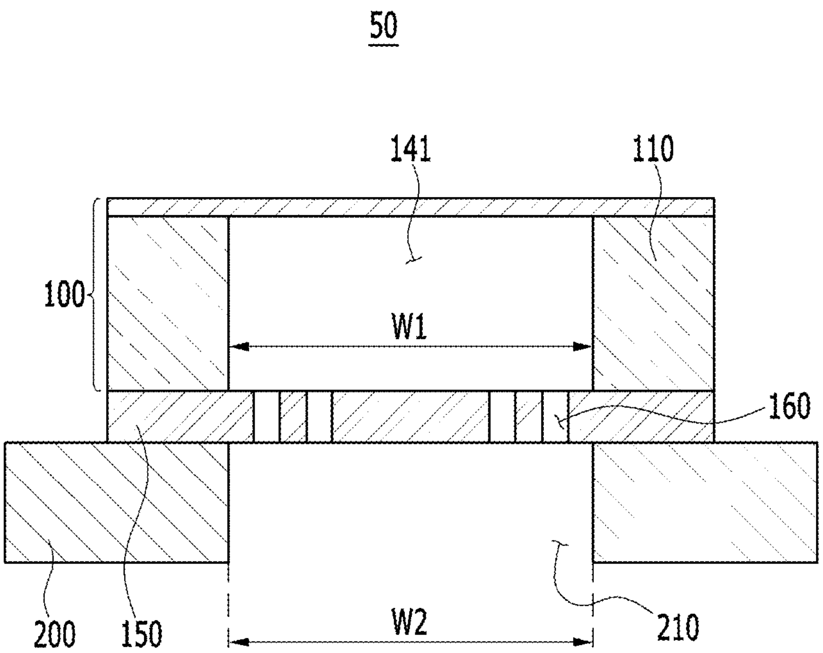
FIG. 1 is a view schematically illustrating a microphone according to an exemplary embodiment in the present disclosure.
Figure 2:
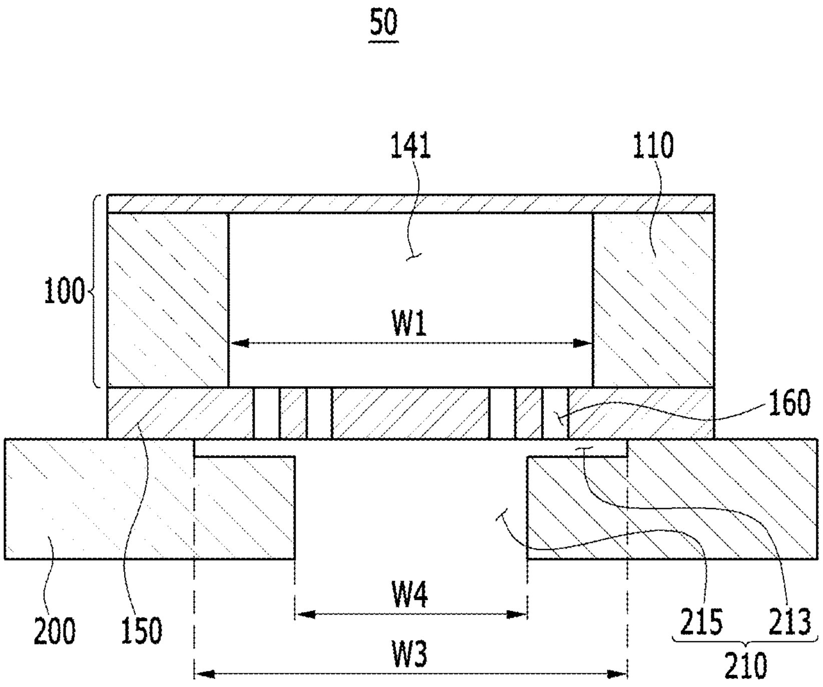
FIG. 2 is a view schematically illustrating a microphone according to another exemplary embodiment in the present disclosure.

FIG. 1 is a view schematically illustrating a microphone according to an exemplary embodiment in the present disclosure, and FIG. 2 is a view schematically illustrating a microphone according to another exemplary embodiment.

Referring to FIG. 1, a microphone 50 includes an acoustic element 100, an acoustic dispersion filter 150, and a case 200.

The acoustic element 100 processes an acoustic signal introduced from the outside and transmits the processed acoustic signal to a processing module (not shown). That is, the acoustic element 100 may receive an acoustic signal through an acoustic hole 141 formed in a substrate 110 from the outside, may be vibrated by sound pressure according to the received acoustic signal to generate an electrical signal, and may transmit the generated electrical signal to the processing module.

The acoustic element 100 may be configured using a micro-electro mechanical system (MEMS) technology.

The acoustic element 100 will be described in more detail below with reference to FIG. 3.

The acoustic dispersion filter 150 is positioned between the acoustic element 100 and the case 200. That is, the acoustic dispersion filter 150 is disposed below the acoustic element 100 and above the case 200.

The acoustic dispersion filter 150 includes a plurality of through holes 160. The plurality of through holes 160 may be provided in positions corresponding to an acoustic hole 141 provided in the substrate 110, and may be provided in positions corresponding to an acoustic inlet 210 of the acoustic dispersion filter 150. The plurality of through holes 160 may disperse an acoustic signal having high pressure or air pressure introduced to the acoustic element so as not to concentrate on the vibrating diaphragm 115 or the fixed electrode 125 of the acoustic element 100. Thus, the microphone 50 according to an exemplary embodiment in the present disclosure may be prevented from being damaged by air pressure or an acoustic signal having high pressure introduced from the outside through the acoustic dispersion filter 150.

The acoustic dispersion filter 150 is ion-implanted to be formed on one side of the substrate 110 formed of silicon. Hardness of the acoustic dispersion filter 150 may be greater than that of the acoustic element 100. Thus, in the microphone 50 according to the present exemplary embodiment, since the acoustic element 100 is attached to the case 200 through the acoustic dispersion filter 150, a change in performance that may be made according to a change in stress due to an adhesive may be prevented.

The case 200 is positioned below the acoustic element 100 and includes an acoustic inlet 210.

The acoustic inlet 210 is a passage through which an acoustic signal generated from the outside is introduced. The acoustic inlet 210 may be formed in a position corresponding to the acoustic hole 141 of the acoustic element 100.

A width W2 of the acoustic inlet 210 may be equal to a width W1 of the acoustic hole 141.

Furthermore, as illustrated in FIG. 2, the acoustic inlet 210 may include a first inlet 213 and a second inlet 215.

A width W3 of the first inlet 213 may be different from a width W4 of the second inlet 215.

That is, the width W3 of the first inlet 213 may be greater than the width W4 of the second inlet 215. For example, the width W3 of the first inlet 213 may be greater than or equal to the width W1 of the acoustic hole 141, and the width W4 of the second inlet 215 may be narrower than the width W1 of the acoustic hole 141.

When the width W3 of the first inlet 213 is greater than the width W4 of the second inlet 215, an acoustic signal introduced from the outside may be input to the acoustic element 100 in a dispersed manner.

The case 200 may be formed of any one material among a metal, a flame retardant 4 (FR4), and ceramic. A cross-section of the case 200 may have a polygonal shape, such as a quadrangular shape, or it may have a circular or oval shape.

Figure 3:
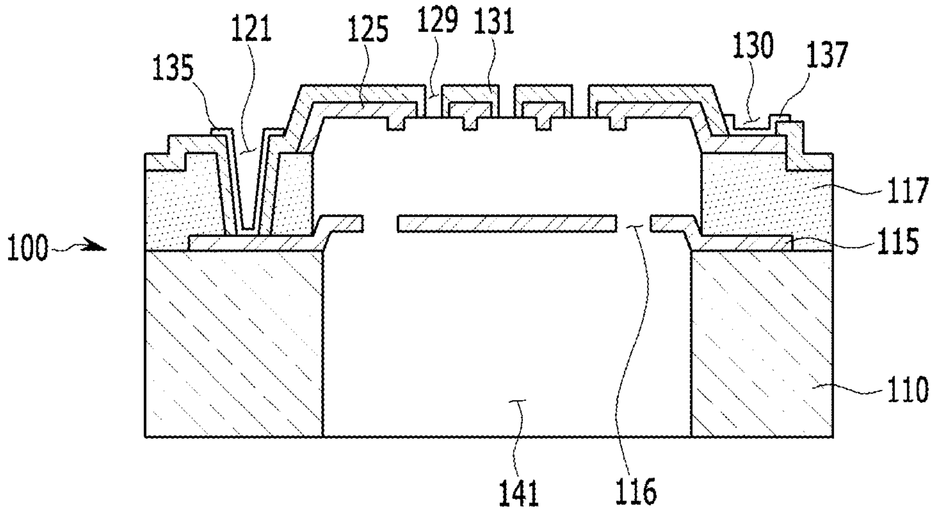
FIG. 3 is a view illustrating an acoustic element according to an exemplary embodiment in the present disclosure.

FIG. 3 is a view illustrating an acoustic element according to an exemplary embodiment in the present disclosure.

Referring to FIG. 3, the acoustic element 100 includes the substrate 110, a vibrating diaphragm 115, a support layer 117, a fixed electrode 125, and an insulating layer 131.

The substrate 110 may be formed of silicon, and includes an acoustic hole 141.

The vibrating diaphragm 115 is formed on the substrate 110 and covers the acoustic hole 141 formed on the substrate 110. A portion of the vibrating diaphragm 115 is exposed by the acoustic hole 141, and a portion of the vibrating diaphragm 115 exposed by the acoustic hole 141 vibrates according to an acoustic signal introduced from the outside.

The vibrating diaphragm 115 includes a plurality of slots 116. Such a slot 116 is disposed on the acoustic hole 141.

The support layer 117 is formed on the vibrating diaphragm 115. The support layer 117 may be formed in an edge portion of the vibrating diaphragm 115 and may support the fixed electrode 125.

A first contact hole 121 exposing the vibrating diaphragm 115 is formed in the support layer 117. A first pad 135 is formed in the first contact hole 121.

The first pad 135 is formed in the first contact hole 121 and is connected to the vibrating diaphragm 115. The first pad 135 may be formed of a metal.

The fixed electrode 125 is formed to be spaced apart from the vibrating diaphragm 115. The fixed electrode 125 includes a plurality of air inlets 129. The fixed electrode 125 is formed and fixed to the support layer 117.

The fixed electrode 125 may be formed of polysilicon or a metal.

An air layer is formed between the vibrating diaphragm 115 and the fixed electrode 125. The vibrating diaphragm 115 and the fixed electrode 125 are formed to be spaced apart from one another by an interval. An acoustic signal is introduced through the acoustic hole 141 from the outside to stimulate the vibrating diaphragm 115, and accordingly, the vibrating diaphragm 115 vibrates. When the vibrating diaphragm 115 vibrates, a space between the vibrating diaphragm 115 and the fixed electrode 125 is changed, and accordingly, an acoustic signal between the vibrating diaphragm 115 and the fixed electrode 125 is changed. The thusly changed acoustic signal is output to a processing module through a first pad 135 connected to the vibrating diaphragm 115 and a second pad 137 connected to the fixed electrode 125.

A case in which the vibrating diaphragm 115 and the fixed electrode 125 are separately formed is described as an example, but the present disclosure is not limited thereto and the vibrating diaphragm 115 and the fixed electrode 125 may be formed as a single layer.

The insulating layer 131 is formed on the fixed electrode 125, and a second contact hole 130 exposing the fixed electrode 125 is formed in the insulating layer 131. The second pad 137 is formed in the second contact hole 130.

The insulating layer 131 may be formed of silicon nitride.

The second pad 137 is formed in the second contact hole 130 and connected to the fixed electrode 125. The second pad 137 may be formed of a metal.

A method for manufacturing the microphone 50 according to an exemplary embodiment in the present disclosure will be described with reference to FIGS. 4 through 16. FIGS. 4 to 16 are views sequentially illustrating a method for manufacturing a microphone 50 according to the exemplary embodiment.

Figure 4:
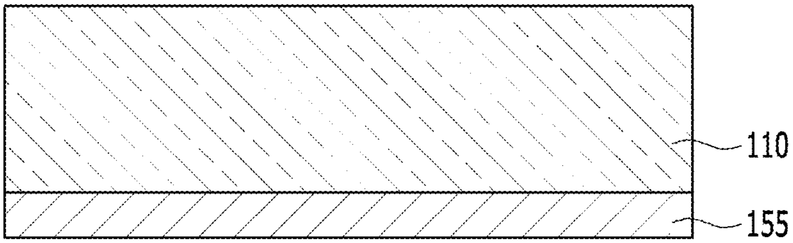
FIGS. 4 to 16 are views sequentially illustrating a method for manufacturing a microphone according to an exemplary embodiment in the present disclosure.

Referring to FIG. 4, a substrate 110 is prepared to form an acoustic element 100, and a filter layer 155 is formed on one side of the substrate 110 to form an acoustic dispersion filter 150. That is, the substrate formed of silicon is prepared, and ions are implanted on one side of the substrate 110 formed of silicon to form the filter layer 155.

Figure 5:
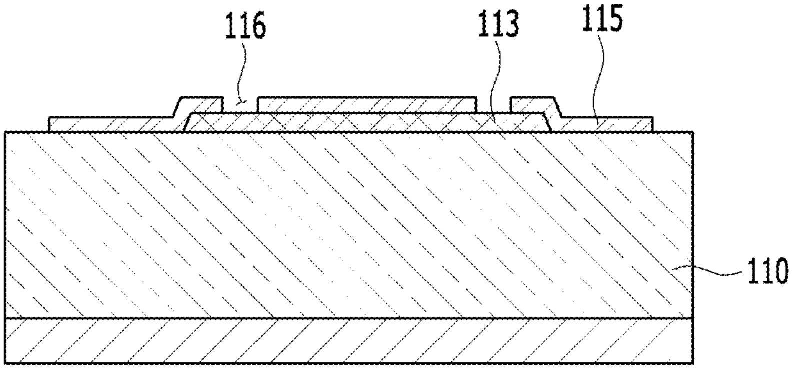

Referring to FIG. 5, an oxide film 113 and a vibrating diaphragm 115 are formed on the substrate 110.

In other words, the oxide film 113 is formed on the other side of the substrate 110 from the filter layer 155, and the vibrating diaphragm 115 is formed on the oxide film 113. That is, a conductive layer for forming the vibrating diaphragm 115 is formed on the oxide film 113. Here, the conductive layer may be formed of a polysilicon layer of a conductive material.

A photosensitive layer is formed on the conductive layer and exposed and developed to form a photosensitive pattern, and the conductive layer is subsequently etched using the photosensitive pattern as a mask to form the vibrating diaphragm 115 including the plurality of slots 116.

Figure 6:
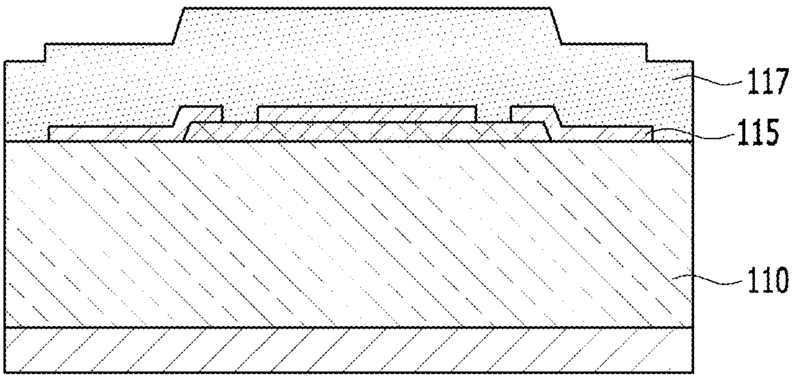

Referring to FIG. 6, a support layer 117 is formed on the substrate 110 and the vibrating diaphragm 115. The support layer 117 may be formed of a silicon oxide or a silicon nitride.

Figure 7:
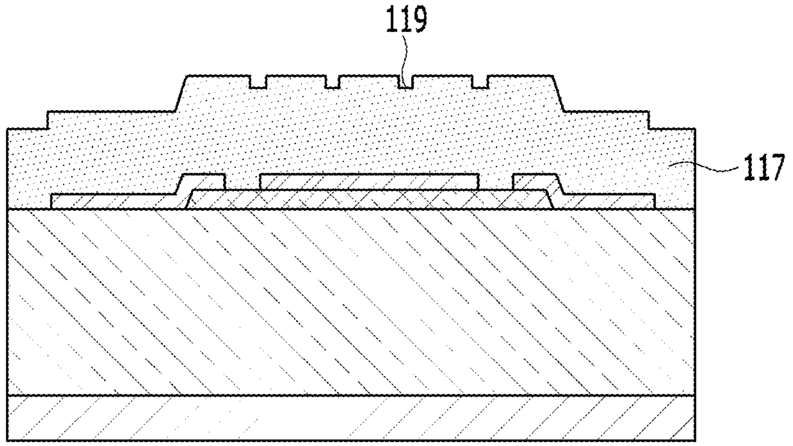

Referring to FIG. 7, a plurality of depressed portions 119 are formed in the support layer 117. The plurality of depressed portions 119 may be formed by etching an upper portion of the support layer 117.

Figure 8:
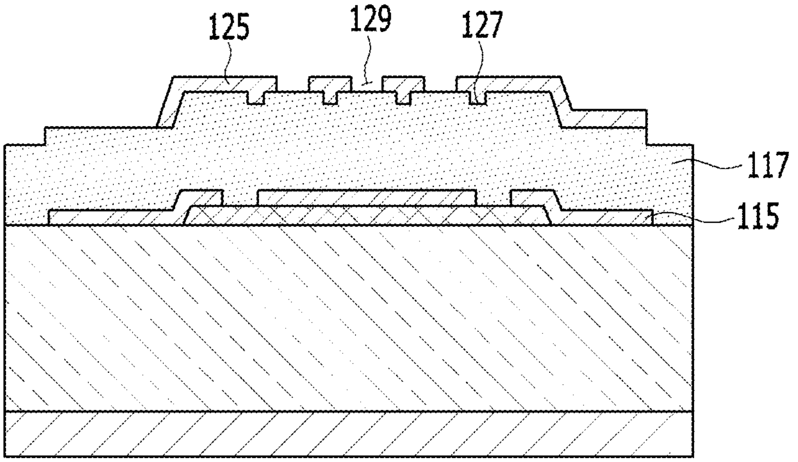

Referring to FIG. 8, a fixed electrode 125 is formed on the support layer 117.

In other words, an electrode layer for forming the fixed electrode 125 is formed on the support layer 117, and the fixed electrode 125 including a plurality of air inlets 129 is formed using the electrode layer as a mask.

A plurality of protrusion portions 127 are formed on the fixed electrode 125 such that the plurality of protrusion portions 127 may be inserted into the plurality of depressed portions 119 formed on the support layer 117. The plurality of protrusion portions 127 may prevent the vibrating diaphragm 115 and the fixed electrode 125 from coming into contact with each other when the vibrating diaphragm 115 vibrates.

Figure 9:
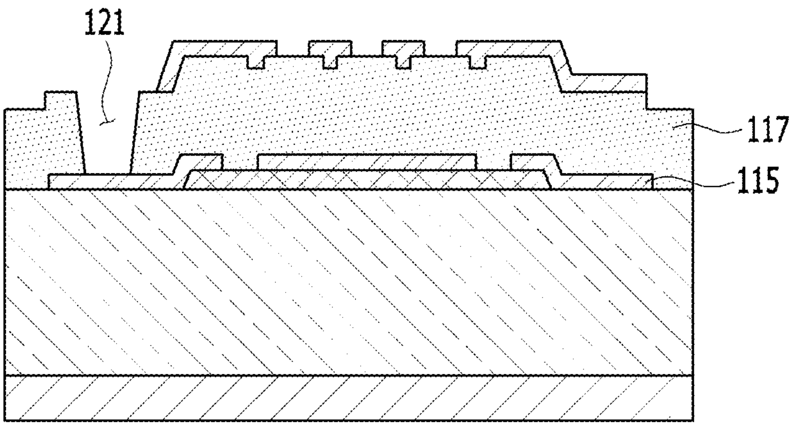

Referring to FIG. 9, the support layer 117 is etched to form a first contact hole 121. That is, one side of the support layer 117 is etched such that the vibrating diaphragm 115 is exposed, to thus form the first contact hole 121. The first contact hole 121 is a hole exposing a portion of the vibrating diaphragm 115 to allow for conduction.

Figure 10:
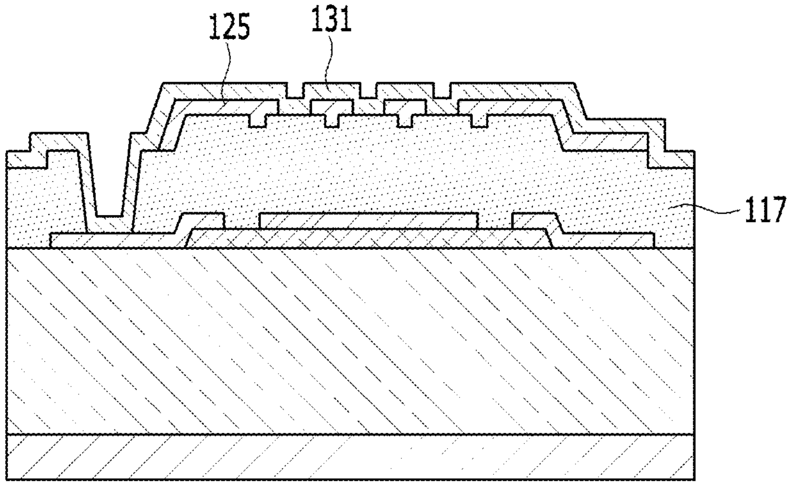

Referring to FIG. 10, an insulating layer 131 is formed on the support layer 117 and the fixed electrode 125. The insulating layer 131 may be formed of a silicon nitride.

Figure 11:
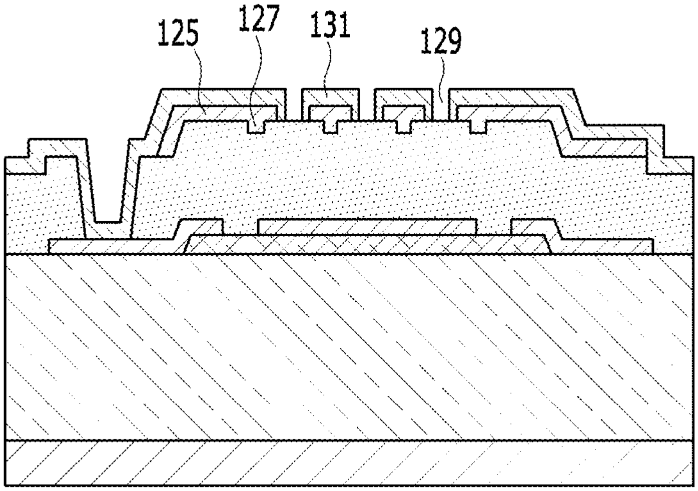

Referring to FIG. 11, the fixed electrode 125 and the insulating layer 131 may be etched to form a plurality of air inlets 129. The plurality of air inlets 129 may be positioned between the protrusions 127 formed in the fixed electrode 125.

Figure 12:
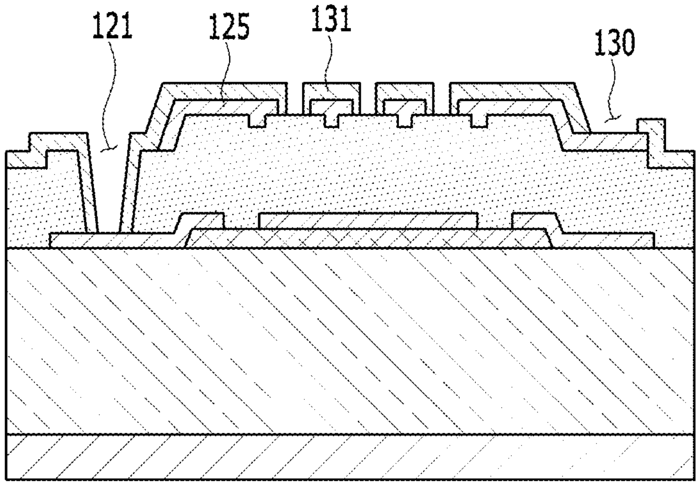

Referring to FIG. 12, the insulating layer 131 may be etched to expose the vibrating diaphragm 115 and the fixed electrode 125. That is, the vibrating diaphragm 115 corresponding to the first contact hole 121 and the fixed electrode 125 corresponding to the second electrode hole 130 may be exposed by etching portions of the insulating layer 131.

Figure 13:
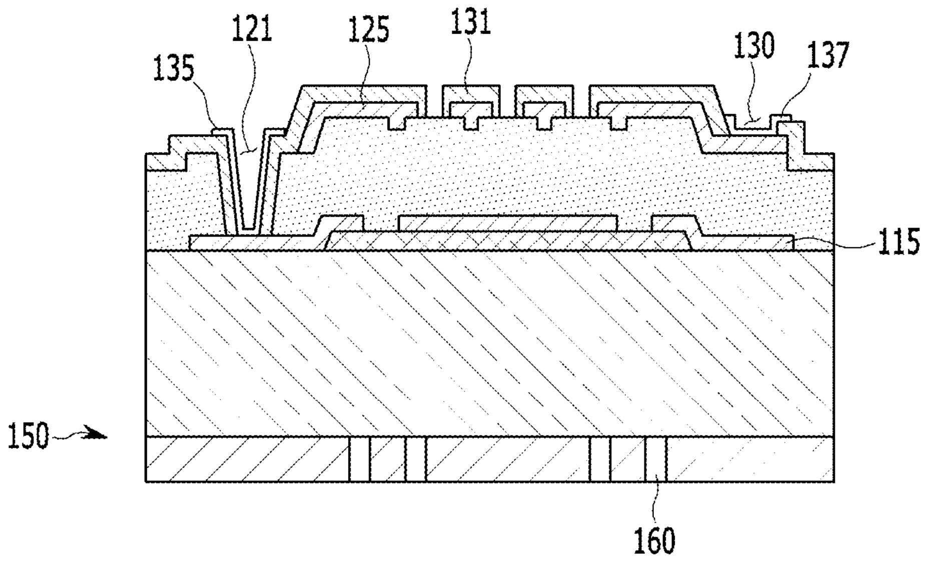

Referring to FIG. 13, a first pad 135 and a second pad 137 are formed on the insulating layer 131. That is, the first pad 135 connected to the vibrating diaphragm 115 is formed in the first contact hole 121 and the insulating layer 131, and the second pad 137 connected to the fixed electrode 125 is formed in the second contact hole 130 and the insulating layer 131.

The first pad 135 and the second pad 137 may be formed of a metal so as to be electrically in contact with a processing module.

The filter layer 155 formed on one side of the substrate 110 is etched to form an acoustic dispersion filter 150 including a plurality of through holes 160.

Figure 14:
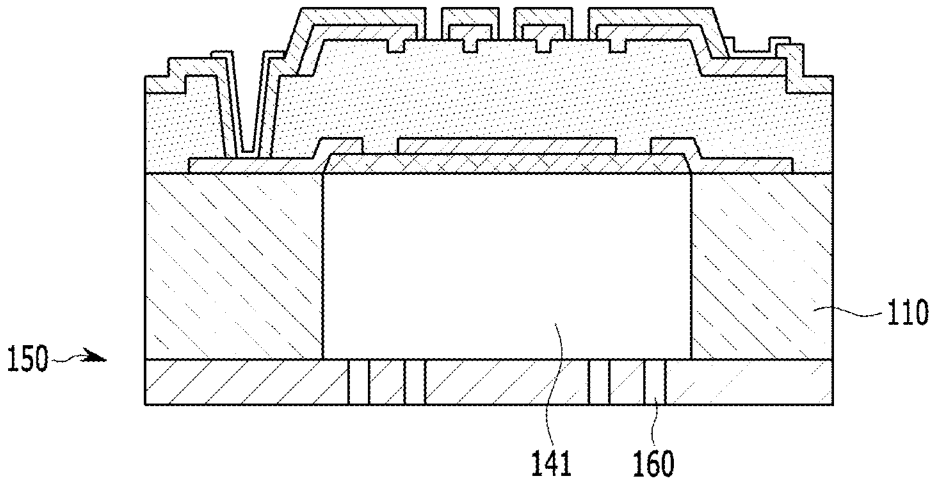

Referring to FIG. 14, the substrate 110 is etched to from an acoustic hole 141. That is, the acoustic hole 141 is formed by etching the substrate 110 using the acoustic dispersion filter 150 as a mask. Here, the acoustic hole 141 may be formed in a position corresponding to the plurality of through holes 160.

Figure 15:
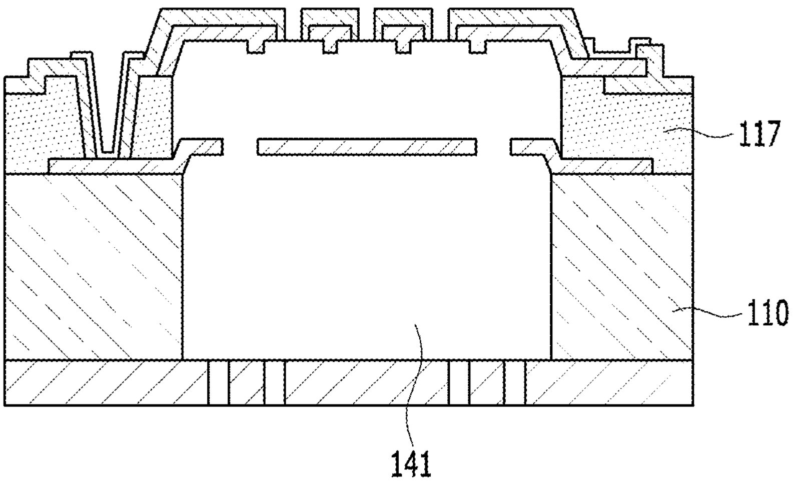

Referring to FIG. 15, the oxide film 113 formed on the substrate 110 is removed and the support layer 117 of a portion corresponding to the acoustic hole 141 is etched.

Figure 16:
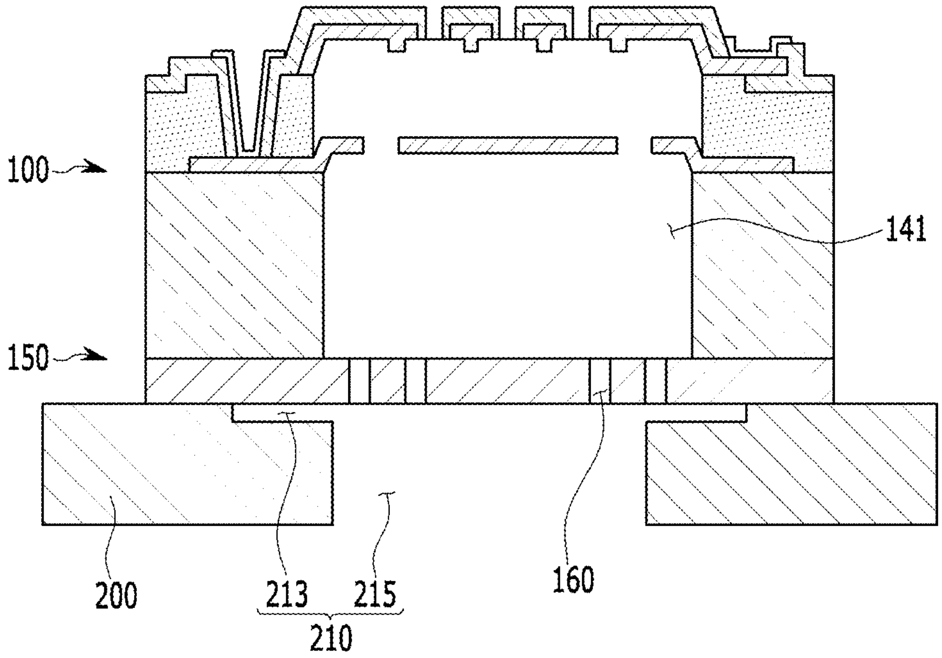

Referring to FIG. 16, the acoustic element 100 and the case 200 are bonded.

Furthermore, a first inlet 213 and a second inlet 215 having different widths are formed.

The acoustic element 100 and the case 200 may be bonded through an adhesive. The adhesive may be any type of adhesive as long as it can bond the acoustic element 100 and the case 200, and may be an epoxy, for example.

The acoustic element 100 and the case 200 may be bonded such that the acoustic inlet 210 including the first inlet 213 and the second inlet 215 is positioned in a position corresponding to the acoustic hole 141 of the acoustic element 100. Also, the acoustic inlet 210 of the case 200 may be formed in a position corresponding to the plurality of through holes 160 included in the acoustic dispersion filter 150.

Accordingly, the acoustic dispersion filter 150 formed on one side of the acoustic element 100 may protect the acoustic element 100 from a change in stress that occurs when the acoustic element 100 is bonded to the case 200, and may prevent distortion of the package.

While this disclosure includes description with reference to the exemplary embodiments, it would be understood by a person skilled in the art that the present invention may be variously modified and altered included within the spirit and scope of the present invention described in the appended claims.

What is claimed is:

1. A method for manufacturing a microphone, the method comprising steps of:

forming an acoustic element including an acoustic dispersion filter on one side of the acoustic element;

forming a case including an acoustic inlet; and bringing the acoustic element and the case into contact with each other, wherein the acoustic dispersion filter includes a plurality of through holes, the acoustic element includes an acoustic hole, the acoustic hole, the plurality of through holes, and the acoustic inlet are formed in positions corresponding to each other;

the step of forming the acoustic element including the acoustic dispersion filter formed on one side of the acoustic element comprises steps of:

preparing a substrate;

forming a filter layer on one side of the substrate;

forming a vibrating diaphragm and a fixed electrode on the other side of the substrate; and etching the filter layer to form the acoustic dispersion filter including the plurality of through holes.

2. The method of claim 1, wherein:

the step of forming the filter layer comprises:

implanting ions into one side of the substrate formed of silicon to form the filter layer.

3. The method of claim 1, wherein:

the step of forming the vibrating diaphragm and the fixed electrode on the other side of the substrate comprises steps of:

forming a vibrating diaphragm on the other side of the substrate;

forming a support layer on the vibrating diaphragm;

forming a fixed electrode on the support layer;

forming an insulating layer on the support layer and the fixed electrode; and etching the substrate to form an acoustic hole.

4. The method of claim 3, further comprising steps of:

after the step of forming the support layer on the vibrating diaphragm, etching the support layer to form a first contact hole such that the vibrating diaphragm is exposed;

forming a fixed electrode on the support layer;

forming an insulating layer on the support layer and the fixed electrode;

etching the insulating layer such that the vibrating diaphragm formed on the first contact hole is exposed, and etching the insulating layer to form a second contact hole such that the fixed electrode is exposed; and forming a first pad in the first contact hole and on the insulating layer and forming a second pad in the second contact hole and on the insulating layer.

5. The method of claim 3, wherein:

the step of etching the substrate to form the acoustic hole comprises a step of:

etching the substrate using the acoustic dispersion filter as a mask to form the acoustic hole.

6. The method of claim 3, further comprising a step of:

after the step of etching the substrate to form the acoustic hole, etching the support layer in a position corresponding to the acoustic hole such that the vibrating diaphragm and the fixed electrode are spaced apart from one another.

7. The method of claim 3, wherein:

in the step of forming the case including the acoustic inlet, the case including the acoustic inlet including a first inlet and a second inlet having different widths is formed.

* * * * *